(12) United States Patent
Chen et al.

(10) Patent No.: US 7,092,307 B2
(45) Date of Patent: Aug. 15, 2006

(54) LEAKAGE CURRENT REDUCTION FOR CMOS MEMORY CIRCUITS

(75) Inventors: Nan Chen, San Diego, CA (US); Cheng Zhong, San Diego, CA (US); Mehdi Hamidi Sani, San Diego, CA (US)

(73) Assignee: Qualcomm Inc., San Diego, CA (US)

( * ) Notice: Subject to any disclaimer, the term of this patent is extended or adjusted under 35 U.S.C. 154(b) by 252 days.

(21) Appl. No.: 10/641,883

(22) Filed: Aug. 14, 2003

(65) Prior Publication Data

US 2004/0196724 A1 Oct. 7, 2004

Related U.S. Application Data

(60) Provisional application No. 60/460,157, filed on Apr. 2, 2003.

(51) Int. Cl.
*G11C 5/14* (2006.01)
(52) U.S. Cl. ...................... 365/226; 365/229
(58) Field of Classification Search ................ 365/226, 365/229, 154, 230.05
See application file for complete search history.

(56) References Cited

U.S. PATENT DOCUMENTS

| | | | |
|---|---|---|---|
| 4,096,584 A | 6/1978 | Owen et al. | |
| 5,070,482 A | 12/1991 | Miyaji | |
| 5,771,199 A * | 6/1998 | Lee | 365/230.03 |
| 5,859,548 A | 1/1999 | Kong | |
| 6,188,628 B1 * | 2/2001 | Tomotani | 365/226 |
| 6,426,908 B1 * | 7/2002 | Hidaka | 365/222 |
| 6,643,173 B1 * | 11/2003 | Takemura | 365/185.05 |
| 6,657,911 B1 * | 12/2003 | Yamaoka et al. | 365/226 |
| 6,765,817 B1 * | 7/2004 | Takemura | 365/154 |
| 2002/0080676 A1 | 6/2002 | Scott | |
| 2002/0100944 A1 | 8/2002 | Ishibashi et al. | |

\* cited by examiner

*Primary Examiner*—Anh Phung
(74) *Attorney, Agent, or Firm*—Philip R. Wadsworth; Charles D. Brown; Kenyon S. Jenckes (57) ABSTRACT

A CMOS integrated circuit (e.g., an SRAM or a DRAM) is partitioned into a core block, a peripheral block, and a retention block. The core block includes circuits (e.g., memory cells) that are powered on at all times and is coupled directly to power supply and circuit ground. The peripheral block includes circuits that may be powered on or off and are coupled to the power supply via a head switch and/or to circuit ground via a foot switch. The switches and the core block may be implemented with high threshold voltage (high-Vt) FET devices to reduce leakage current. The peripheral block may be implemented with low-Vt FET devices for high-speed operation. The retention block includes circuits (e.g., pull-up devices) that maintain signal lines (e.g., word lines) at a predetermined level so that the internal states of the core block are retained when the peripheral block is powered off.

21 Claims, 9 Drawing Sheets

FIG. 1

PRIOR ART

LEAKAGE CURRENT REDUCTION FOR CMOS MEMORY CIRCUITS

This application claims the benefit of provisional U.S. Application Ser. No. 60/460,157, entitled "SRAM Leakage Reduction," filed Apr. 2, 2003.

BACKGROUND

I. Field

The present invention relates generally to data communication, and more specifically to techniques for reducing leakage current in complementary metal oxide semiconductor (CMOS) circuits.

II. Background

Integrated circuit (IC) fabrication technology continually improves and, as a result, the size of transistors continues to shrink. This enables more transistors and more complicated circuits to be fabricated on an IC die or, alternatively, a smaller die to be used for a given circuit. Smaller transistor size also supports faster operating speed and provides other benefits.

For CMOS technology, which is widely used for digital circuits and some analog circuits, a major issue with shrinking transistor size is standby power. A smaller transistor geometry results in higher electric field, which stresses a transistor and causes oxide breakdown. To decrease the electric field, a lower power supply voltage is often used for smaller geometry transistors. Unfortunately, the lower power supply voltage also increases the delay of the transistors, which is undesirable for high-speed circuits. To reduce the delay and improve operating speed, the threshold voltage (Vt) of the transistors is reduced. The threshold voltage determines the voltage at which the transistors turn on. However, the lower threshold voltage and smaller transistor geometry result in higher leakage current, which is the current passing through a transistor when it is turned off.

Leakage current is more problematic as CMOS technology scales smaller. This is because leakage current increases at a high rate with respect to the decrease in transistor size. Moreover, leakage current is a major issue for certain applications such as portable devices (e.g., cellular phone and portable computer). Leakage current consumes power and reduces standby time for portable devices that use battery power.

Reducing leakage current without sacrificing too much performance is one of the major challenges in CMOS designs, especially as IC technology scales down to 90 nm (nanometer) and smaller. One common method of combating high leakage current in large CMOS circuit designs is to cut off power to a CMOS circuit when it is turned off. Power may be cut off with a head switch, a foot switch, or both. A head switch is a switch placed between a power supply and the CMOS circuit. A foot switch is a switch placed between the CMOS circuit and circuit ground.

A dual-Vt CMOS technology allows for fabrication of both low threshold voltage (low-Vt) and high threshold voltage (high-Vt) field effect transistor (FET) devices on the same IC die. Since speed is not critical for head and foot switches, these switches may be implemented with high-Vt FET devices to reduce leakage current. The CMOS circuit is implemented with low-Vt FET devices for high-speed operation. During normal operation, the switches are turned on and the CMOS circuit operates with the speed advantage of the low-Vt FET devices. In a standby mode, which is also referred to as a sleep mode, the switches are turned off and the CMOS circuit is disabled. Since the leakage current of a high-Vt FET device may be as much as 10 to 100 times less than the leakage current of a low-Vt FET device, leakage current of the CMOS circuit is reduced by the use of high-Vt FET devices for the switches.

The method described above for reducing leakage current (i.e., with high-Vt FET devices for the switches and low-Vt FET devices for the CMOS circuit) is adequate for some CMOS circuits. However, disconnecting the power supply with a head switch and/or circuit ground with a foot switch may be detrimental for certain CMOS circuits. One such CMOS circuit is a static random access memory (SRAM) with memory cells implemented with FET devices. For the SRAM, disconnecting the power supply and/or circuit ground causes the FET devices to float, which may cause the memory cells to lose their internal states. Consequently, data may be lost when the SRAM is placed in the standby mode.

There is therefore a need in the art for techniques to reduce leakage current for CMOS circuits such as SRAM.

SUMMARY

Techniques are provided herein for achieving high performance with low-Vt FET devices where possible and reducing leakage current with high-Vt FET devices. These techniques may be used for various types of CMOS circuits such as an SRAM, a dynamic RAM (DRAM), a controller, a digital signal processor (DSP), a microprocessor, and similar ciruits.

In one embodiment, a CMOS circuit in an integrated circuit is partitioned into a "core" block, a "peripheral" block, and (if needed) a "retention" block. The core block includes circuits that are powered on at all times (i.e., in an operational mode as well as a standby mode). The core block is thus coupled directly to power supply and circuit ground. The peripheral block includes circuits that can be powered on in the operational mode and powered off in the standby mode. The peripheral block may be coupled to the power supply via a head switch and/or to circuit ground via a foot switch. The retention block is powered on and enabled in the standby mode to maintain internal states of the core block in the standby mode. The core block and retention block may be implemented with high-Vt FET devices to reduce leakage current. The head and foot switches are also implemented with high-Vt FET devices. The peripheral block may be implemented with low-Vt FET devices for high-speed operation without impacting leakage current because high-Vt FET devices are used for the head and foot switches.

In another embodiment, a memory unit (e.g., an SRAM or a DRAM) is provided having a core block, a peripheral block, and a retention block. The core block includes memory cells implemented with high-Vt FET devices. The peripheral block includes support circuits (e.g., control circuitry, decoding circuitry, word line drivers, datapath circuitry, etc.) for the memory cells and are implemented with low-Vt FET devices. The peripheral block may be coupled to the power supply via a head switch and/or to circuit ground via a foot switch. The retention block maintains word lines for the memory cells at a predetermined level (e.g., logic low) so that the internal states of the memory cells are retained in the standby mode. For example, the retention block may include pull-up FET devices that can pull up the inputs of word line drivers within the peripheral block, which then causes the word lines to remain at logic low and prevents data from being written to the memory cells in the standby mode.

Various aspects, embodiments, and features of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

Figure 1:
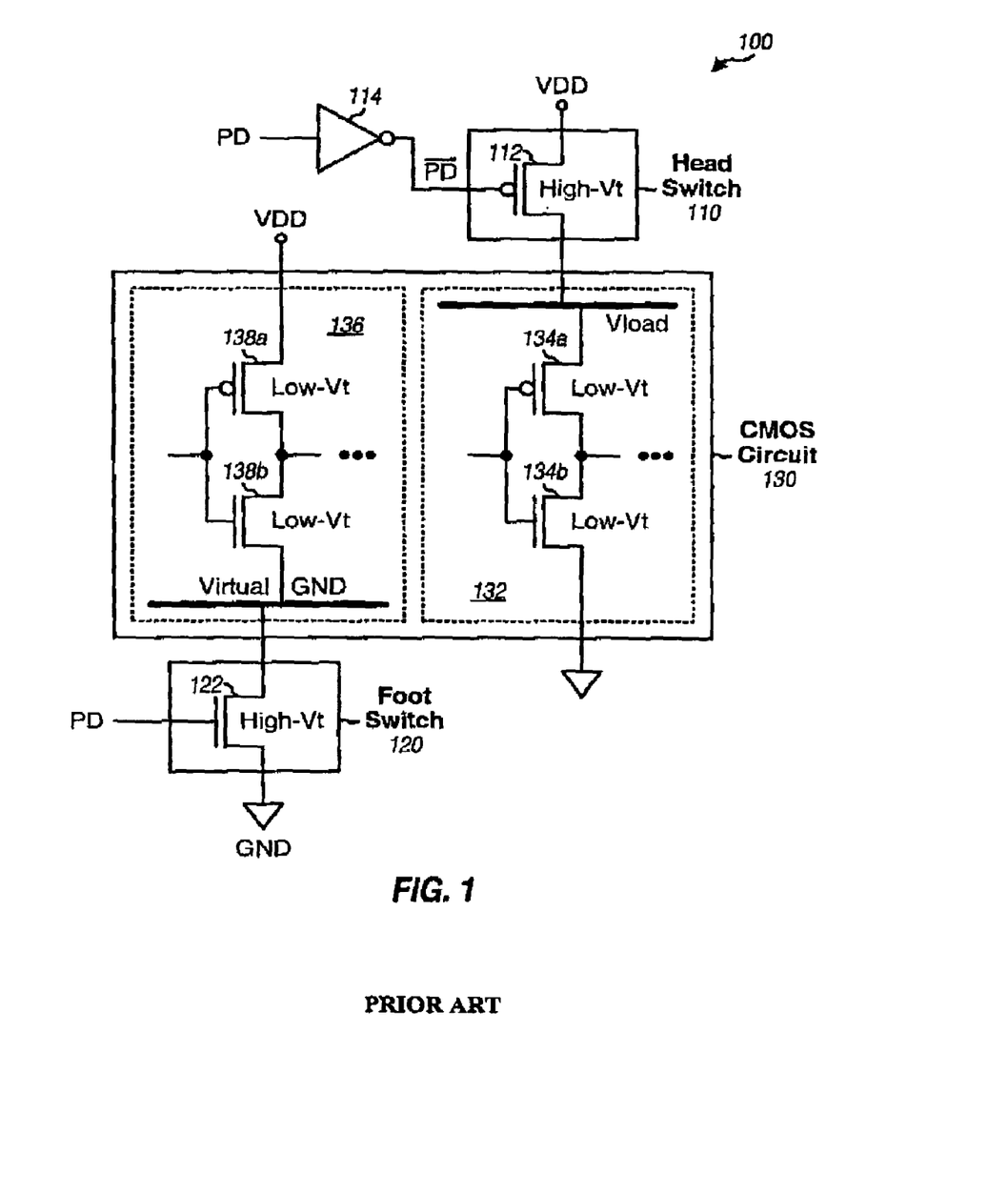
FIG. 1 shows a conventional integrated circuit with a head switch and a foot switch.

FIG. 1 shows a schematic diagram of a conventional integrated circuit 100 with a head switch 110 and a foot switch 120 for reducing leakage current of a CMOS circuit 130. Head switch 110 is implemented with a high-Vt P-channel FET (P-FET) device 112, and foot switch 120 is implemented with a high-Vt N-channel FET (N-FET) device 122. P-FET device 112 has a source that couples to a power supply, VDD, a gate that receives a control signal $\overline{PD}$, and a drain that provides a load supply, Vload. The control signal $\overline{PD}$ is obtained by inverting a control signal PD with an inverter 114. N-FET device 122 has a source that couples to circuit ground, GND, a gate that receives the control signal PD, and a drain that provides a virtual GND, VGND.

CMOS circuit 130 includes circuits 132 that couple to the load supply and circuit ground and circuits 136 that couple to the power supply and virtual ground. A circuit may be powered off by disconnecting either the power supply or circuit ground from the circuit. Depending on the specific designs, some circuits may be more conveniently powered off by disconnecting the power supply while other circuits may be more conveniently powered off by disconnecting the circuit ground. In FIG. 1, CMOS circuit 130 is symbolically shown as comprising two pairs of low-Vt FET devices, i.e., a first pair of FET devices 134a and 134b for circuits 132 and a second pair of FET devices 138a and 138b for circuits 136.

Integrated circuit 100 operates in either an operational mode or a standby mode at any given moment, depending on the state of the control signal PD. In the operational mode, the control signal PD is at logic high (e.g., near the power supply voltage, VDD), N-FET device 122 is turned on, the control signal $\overline{PD}$ is at logic low, and P-FET device 112 is also turned on. The load supply is then approximately equal to the power supply (i.e., Vload≈VDD), and virtual ground is approximately equal to circuit ground (i.e., VGND≈GND). CMOS circuit 130 is then powered on and operates in its intended manner. In the standby mode, which is also referred to as the sleep mode, the control signal PD is at logic low (e.g., near circuit ground), N-FET device 122 is turned off, the control signal $\overline{PD}$ is at logic high, and P-FET device 112 is also turned off. The load supply is then disconnected from the power supply, and virtual ground is also disconnected from circuit ground. CMOS circuit 130 is thus powered off and floats. However, even though P-FET device 112 and N-FET device 122 are both turned off, leakage current is drawn through these devices and CMOS circuit 130. The amount of leakage current is reduced by the use of high-Vt FET devices 112 and 122 for head switch 110 and foot switch 120, respectively.

The design shown in FIG. 1 provides good leakage current control for CMOS circuits that do not need to maintain states in the standby mode. However, for some CMOS circuits such as SRAM, powering down the entire CMOS circuit would have adverse effects. If the entire SRAM is powered down via the head and/or foot switches as shown in FIG. 1, then the memory cells within the SRAM will be disconnected from the power supply and circuit ground. The memory cells would then float and data may be lost. For SRAM and other CMOS circuits, techniques are needed to reduce leakage current while avoiding adverse effects resulting from powering down the entire CMOS circuit.

Figure 2:
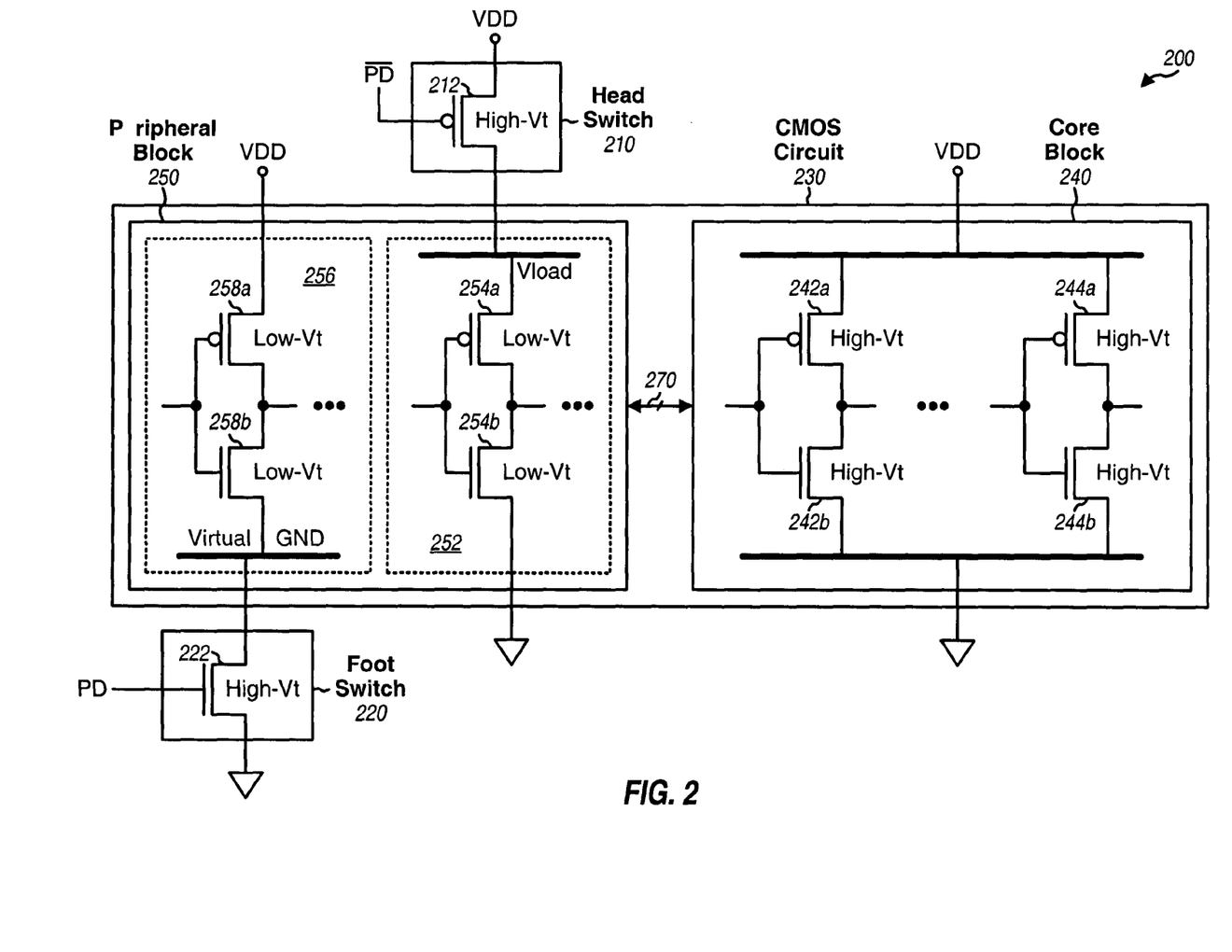
FIG. 2 shows an integrated circuit with a core block and a peripheral block designed for high-speed operation and reduced leakage current.

FIG. 2 shows a schematic diagram of an integrated circuit 200 with a partitioned CMOS circuit. Integrated circuit 200 includes a head switch 210, a foot switch 220, and a CMOS circuit 230 that comprises a core block 240 and a peripheral block 250. CMOS circuit 230 may be a memory unit such as an SRAM or a DRAM.

Core block 240 includes circuits that need to be powered on at all times (e.g., memory cells) and is thus directly coupled to the power supply and circuit ground. This enables core block 240 to retain its internal states even when other parts of integrated circuit 200 are powered down. For the embodiment shown in FIG. 2, core block 240 performs functions that do not require high speed and is thus implemented with high-Vt FET devices to reduce leakage current. For simplicity, core block 240 is symbolically shown as comprising two pairs of high-Vt FET devices 242a and 242b and 244a and 244b.

Peripheral block 250 includes circuits that may be powered on and off (e.g., support circuitry for the memory cells). For the embodiment shown in FIG. 2, peripheral block 250 includes (1) circuits 252 that couple to the power supply via head switch 210 and directly to circuit ground and (2) circuits 256 that couple directly to the power supply and to circuit ground via foot switch 220. For the embodiment shown in FIG. 2, peripheral block 250 performs high-speed functions and is thus implemented with low-Vt FET devices. For simplicity, peripheral block 250 is symbolically shown as comprising a pair of low-Vt FET devices 254a and 254b for circuits 252 and a pair of low-Vt FET devices 258a and 258b for circuits 256. In general, peripheral block 250 may be designed such that some, none, or all of the FET devices within the block couple to head switch 210 and some, none, or all of the FET devices within the block couple to foot switch 220. Core block 240 and peripheral block 250 may interact/communicate with each other via signal lines 270.

Head switch 210 is implemented with a high-Vt P-FET device 212 and couples between the power supply and peripheral block 250. Foot switch 220 is implemented with a high-Vt N-FET device 222 and couples between peripheral block 250 and circuit ground. The gate of N-FET device 222 receives the control signal PD, and the gate of P-FET device 212 receives the control signal $\overline{PD}$. The control signals PD and $\overline{PD}$ may be provided by a control unit that is located within or external to integrated circuit 200. A head switch or a foot switch may also be implemented with multiple FET devices coupled in parallel to reduce the ON resistance of the switch, which then reduces both the voltage drop across the switch and the power dissipation by the switch when it is turned on.

The operation of head switch 210 and foot switch 220 for peripheral block 250 is similar to that described above for integrated circuit 100. The control signal PD enables and disables head switch 210 and foot switch 220, which in turn power on and off peripheral block 250. Although peripheral block 250 is implemented with low-Vt FET devices, leakage current is reduced through the use of high-Vt FET devices 212 and 222 for head switch 210 and foot switch 220, respectively. P-FET device 212 and N-FET device 222 may be designed with sufficiently large sizes such that the ON resistance of each device is small and the drain-to-source voltage ($V_{DS}$) drop across each device is within design limits, given the maximum expected circuit load, when these devices are turned on.

In general, CMOS circuit 230 may be any circuit (e.g., any memory circuit) comprised of (1) a core block that is coupled directly to the power supply and circuit ground and (2) a peripheral block that is coupled to the power supply via a head switch and/or to circuit ground via a foot switch. By partitioning CMOS circuit 230 into the core and peripheral blocks and by powering on only the necessary block(s), leakage current is reduced. The core block may be implemented with high-Vt FET devices, if possible, to reduce leakage current. The peripheral block may be implemented with low-Vt FET devices for high-speed operation without impacting leakage current because high-Vt FET devices are used for the head and foot switches for the peripheral block.

Figure 3:
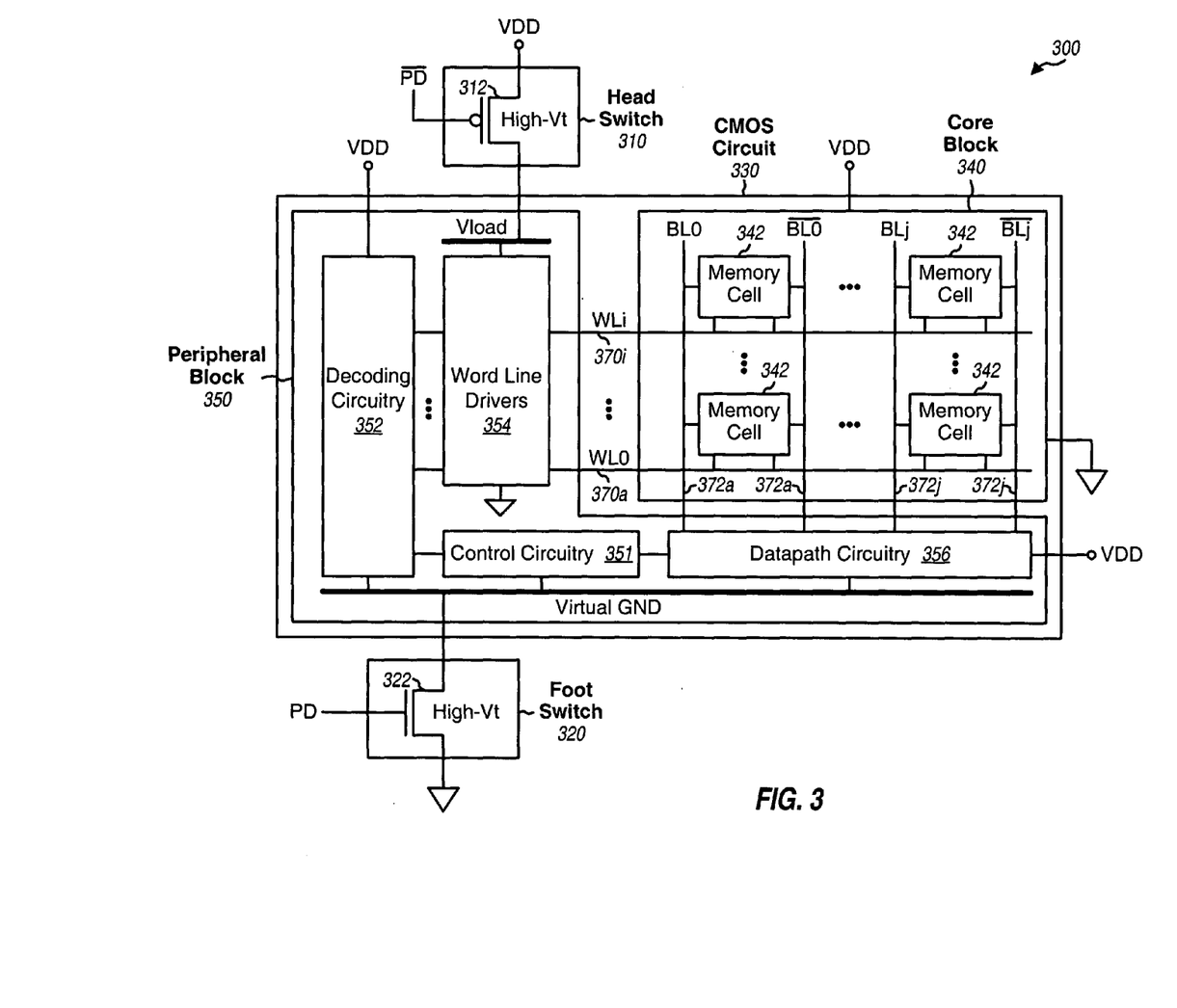
FIG. 3 shows a memory unit with a core block and a peripheral block.

FIG. 3 shows a schematic diagram of a memory unit 300 with partitioned blocks. Memory unit 300 may be an SRAM, a DRAM, or some other type of memory. Memory unit 300 includes a head switch 310 implemented with a high-Vt P-FET device 312, a foot switch 320 implemented with a high-Vt N-FET device 322, and a CMOS circuit 330. CMOS circuit 330 comprises a core block 340 and a peripheral block 350. Core block 340 includes memory cells 342 that are powered on at all times (i.e., in the operational and standby modes) in order to retain the data. Core block 340 is thus directly coupled to the power supply and circuit ground.

Peripheral block 350 includes support circuitry for memory cells 342 in core block 340. For the embodiment shown in FIG. 3, peripheral block 350 includes control circuitry 351, decoding circuitry 352, word line drivers 354, and datapath circuitry 356. Control circuitry 351 generates the internal clock to control the operation of memory unit 300. Decoding circuitry 352 receives input signals (not shown in FIG. 3) and asserts selected ones of the word lines to enable data read or write of the memory cells. Word line drivers 354 receive and buffer the outputs of decoding circuitry 352 and drive word lines 370. An asserted word line enables all of the memory cells coupled to that word line. For a data read operation, each enabled memory cell provides its data to an associated pair of complementary bit lines 372. Datapath circuitry 356 amplifies the signals on bit lines 372, detects the data values of the amplified signals (e.g., logic low or high), and provides output data via I/O lines (not shown in FIG. 3). For a data write operation, datapath circuitry 356 receives input data via the I/O lines and stored the data in each enabled memory cell via the associated pair of complementary bit lines 372.

Peripheral block 350 may be powered on in the operational mode and powered off in the standby mode. The circuits within peripheral block 350 are thus coupled to the power supply via head switch 310 and/or to circuit ground via foot switch 320. The circuits within peripheral block 350 may be implemented with low-Vt FET devices to support high-speed access (i.e., data read and write) of memory cells 342. Memory cells 342 within core block 340 may be implemented with high-Vt FET devices to reduce leakage current. Other techniques may be used to support high access rate for memory cells 342, as described below.

Figure 4A:
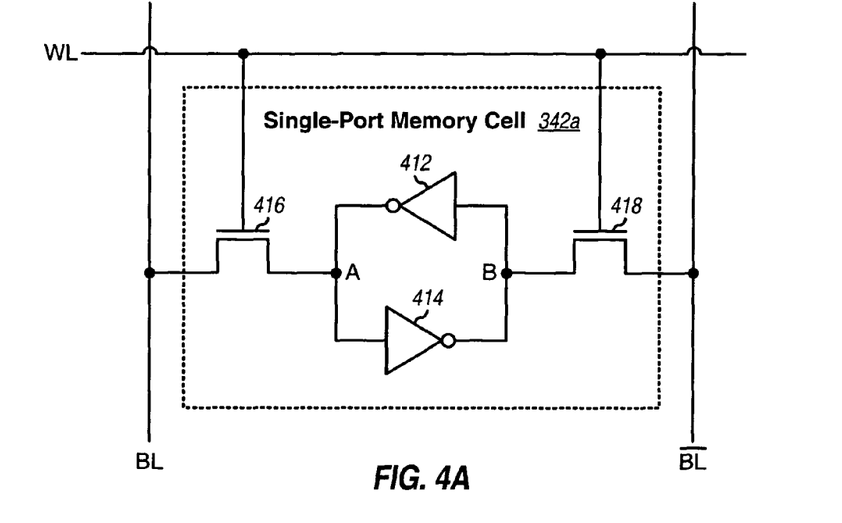
FIGS. 4A and 4B show a single-port memory cell and a dual-port memory cell, respectively.

FIG. 4A shows a schematic diagram of a single-port memory cell 342a, which may be used for each of memory cells 342 in FIG. 3. Memory cell 342a includes a pair of inverters 412 and 414 and a pair of N-FET devices 416 and 418. Inverters 412 and 414 are cross-coupled such that the output of one inverter couples to the input of the other inverter. Each of inverters 412 and 414 may be implemented with a pair of complementary FET devices (e.g., FET devices 242a and 242b in FIG. 2). N-FET device 416 has a drain that couples to a bit line BL, a source that couples to node A at the output of inverter 412, and a gate that couples to the word line WL. Similarly, N-FET device 418 has a drain that couples to a complementary bit line $\overline{BL}$, a source that couples to node B at the output of inverter 414, and a gate that couples to the word line WL. Memory cell 342a is also referred to as a 6T cell because it can be implemented with 6 FET devices.

Memory cell 342a operates as follows. If word line WL is at logic low, then N-FET devices 416 and 418 are turned off, and memory cell 342a is disabled and cannot be accessed. Conversely, if word line WL is at logic high, then N-FET device 416 or 418 is turned on, and memory cell 342a is enabled and may be accessed. For a data read operation, if node A is at logic low and memory cell 342a is enabled, then N-FET device 416 turns on and pulls the bit line BL to logic low. Conversely, if node B is at logic low and memory cell 342a is enabled, then N-FET device 418 turns on and pulls the complementary bit line $\overline{BL}$ to logic low. For a data write operation, the bit line BL or complementary bit line $\overline{BL}$ that is at logic low causes its associated N-FET device 416 or 418 to turn on, which then provides logic low to the associated node A or B. For memory cell 342a, a logic low word line thus disables the memory cell and a logic high word line enables the memory cell.

The memory cells in the core block may be implemented with high-Vt FET devices to reduce leakage current. The memory cells may then have a slower operating speed than the support circuitry within the peripheral block, which is implemented with low-Vt FET devices. A multi-port memory cell may be used to support high-speed memory access.

Figure 4B:
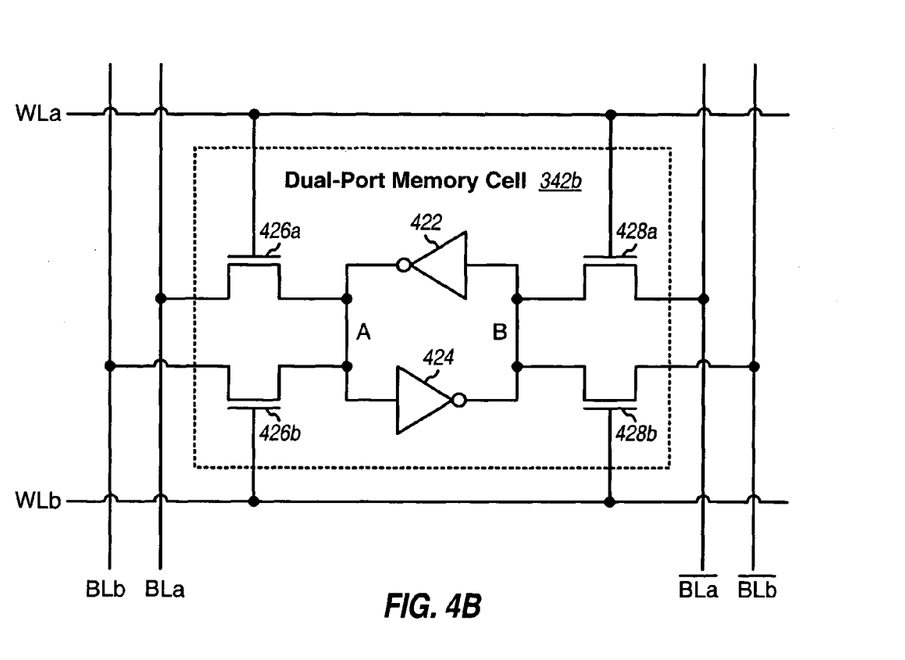

FIG. 4B shows a schematic diagram of a dual-port memory cell 342b, which may also be used for each of memory cells 342 in FIG. 3. Memory cell 342b includes a pair of inverters 422 and 424 and two pairs of N-FET devices 426a and 426b and 428a and 428b. Inverters 422 and 424 are cross-coupled. N-FET devices 426a and 426b have drains that couple to bit lines BLa and BLb, respectively, sources that couple to node A, and gates that couple to word lines WLa and WLb, respectively. Similarly, N-FET devices 428a and 428b have drains that couple to complementary bit lines $\overline{BLa}$ and $\overline{BLb}$, respectively, sources that couple to node B, and gates that couple to word lines WLa and WLb, respectively.

Word line WLa, bit lines BLa and $\overline{BLa}$, and N-FET devices 426a and 428a form a first port of memory cell 342b. Word line WLb, bit lines BLb and $\overline{BLb}$, and N-FET devices 426b and 428b form a second port of memory cell 342b. Only one port of memory cell 342b is enabled at any given moment, if at all, to access the memory cell. Word line WLa is asserted to logic low to access memory cell 342b via the first port, and word line WLb is asserted to logic low to access memory cell 342b via the second port. Memory cell 342b is accessed via the enabled port in similar manner as that described above for memory cell 342a.

The dual-port design allows two rows of memory cells to be accessed simultaneously via two word lines and two sets of bit lines. Higher overall access rate may thus be achieved for the memory cells even though they are implemented with high-Vt FET devices. A multi-port memory cell with more than two ports may also be used for each of memory cells 342 in FIG. 3.

For some CMOS circuits such as SRAM or DRAM, maintaining the core block powered on at all times may not be sufficient to ensure that the internal states of the core block will be maintained in the standby mode. If the peripheral block is designed to provide control signals for the core block, then powering down the peripheral block in the standby mode may cause some or all of the control signals to float. The floating control signals may then cause the internal states of the core block to change.

Referring back to FIG. 3, peripheral block 350 floats when head switch 310 and foot switch 320 are turned off in the standby mode. This may then cause some or all of word lines 370 to float to logic high. The logic high on word lines 370 would then enable memory cells 342 coupled to these word lines. Under this scenario, the wrong data may be written into memory cells 342 in the standby mode.

Figure 5:
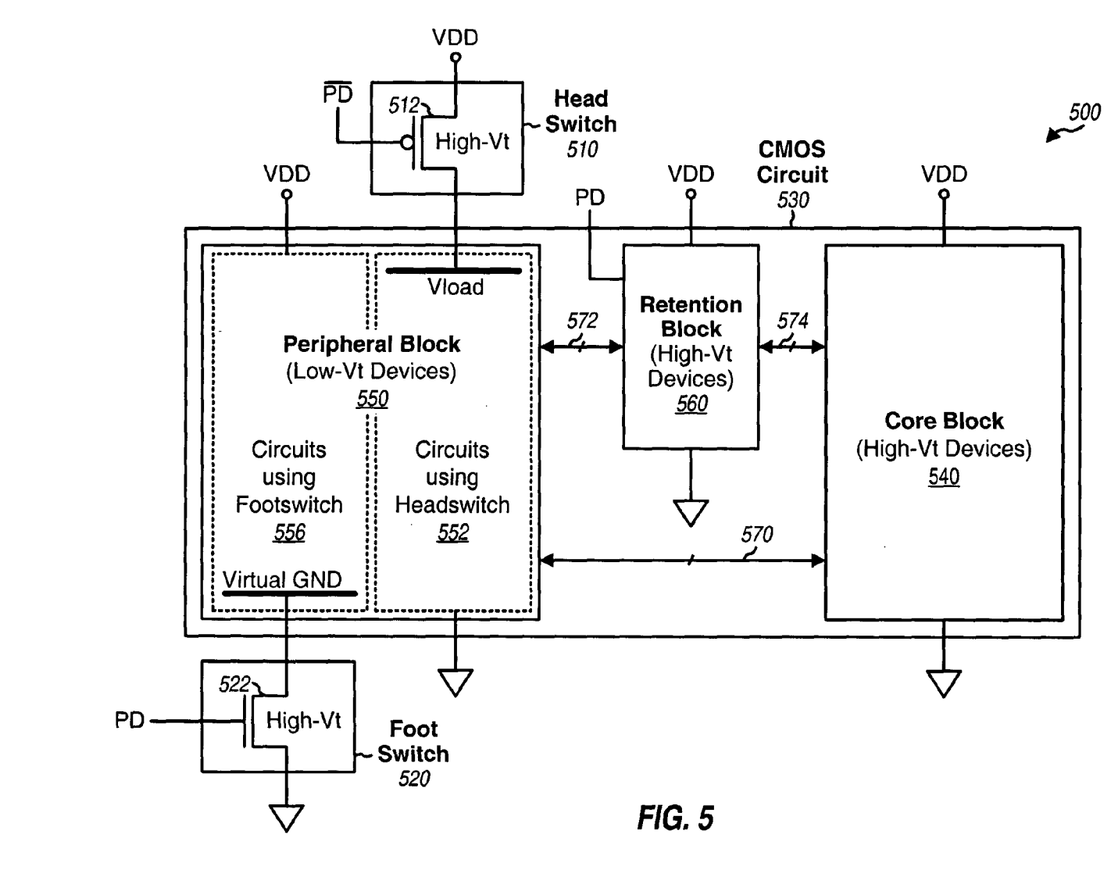
FIG. 5 shows an integrated circuit with a core block, a peripheral block, and a retention block.

FIG. 5 shows a block diagram of an integrated circuit 500 with a partitioned CMOS circuit and retention circuitry to maintain internal states in the standby mode. Integrated circuit 500 includes a head switch 510, a foot switch 520, and a CMOS circuit 530 that comprises a core block 540, a peripheral block 550, and a retention block 560. Core block 540 includes circuits that need to be powered on at all times and is thus directly coupled to the power supply and circuit ground. Peripheral block 550 includes circuits 552 and 556 that may be powered on and off. Circuits 552 couple to the power supply via head switch 510 and directly to circuit ground, and circuits 556 couple directly to the power supply and to circuit ground via foot switch 520. Retention block 560 includes circuits that need to be powered on in the standby mode and is directly coupled to the power supply and circuit ground, as needed.

In the operational mode, core block 540, peripheral block 550, and retention block 560 are all powered on. However, retention block 560 is disabled, for example, by the same control signal that powers on peripheral block 550. Core block 540 and peripheral block 550 communicate with each other via signal lines 570 and perform the designed functions.

In the standby mode, core block 540 and retention block 560 are powered on and peripheral block 550 is powered off by switches 510 and 520. Retention block 560 is also enabled, for example, by the same control signal that powers off peripheral block 550. Retention block 560 may then interact with peripheral block 550 via signal lines 572 to maintain signal lines 570 at a predetermined level. This then retains the internal states of core block 540 when peripheral block 550 is powered off. Alternatively, retention block 560 may communicate directly with core block 540 via signal lines 574 shown in FIG. 5. Core block 540 retains its internal states in the standby mode because it is powered on and its control signals are maintained at the proper level.

Retention block 560 may include pull-up circuits, pull-down circuits, any combination thereof, and similar circuits. The design of retention block 560 is dependent on various factors such as the designs of core block 540 and peripheral block 550, the required level for the control signals, and other similar factors. Several example designs for retention block 560 are described below.

For the embodiment shown in FIG. 5, core block 540 and retention block 560 both perform functions that do not require high speed and are implemented with high-Vt FET devices to reduce leakage current. Peripheral block 550 performs high-speed functions and is implemented with low-Vt FET devices. Leakage current of peripheral block 550 is reduced by use of high-Vt FET devices 512 and 522 for head and foot switches 510 and 520, respectively. For other embodiments, core block 540 and/or retention block 560 may be implemented with low-Vt FET devices for high-speed operation.

Figure 6A:
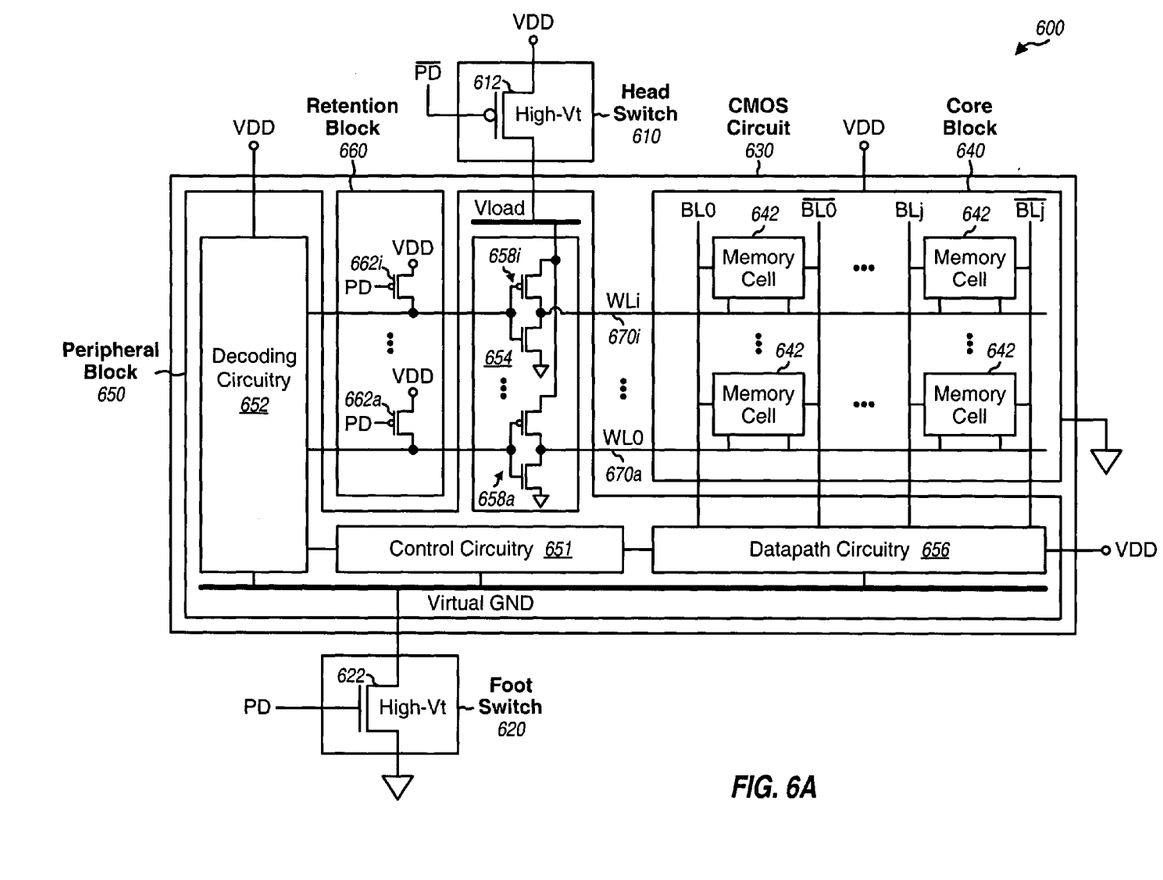
FIGS. 6A and 6B show two designs of a memory unit with a core block, a peripheral block, and a retention block.

FIG. 6A shows a schematic diagram of a memory unit 600 with partitioned blocks and retention circuitry. Memory unit 600 may be an SRAM, a DRAM, or some other type of memory. Memory unit 600 includes a head switch 610, a foot switch 620, and a CMOS circuit 630 that comprises a core block 640, a peripheral block 650, and a retention block 660. Core block 640 includes memory cells 642 that are powered on at all times (i.e., in the operational and standby modes) in order to retain the data. Core block 640 is thus directly coupled to the power supply and circuit ground.

Peripheral block 650 includes support circuitry for memory cells 642. For the embodiment shown in FIG. 6A, the support circuitry in peripheral block 650 includes control circuitry 651, decoding circuitry 652, word line drivers 654, and datapath circuitry 656, all of which operate as described above for memory unit 300 in FIG. 3. For the embodiment shown in FIG. 6A, word line drivers 654 include one inverting buffer 658 for each word line. Each inverting buffer 658 is implemented with a P-FET device and an N-FET device. Each inverting buffer 658 has an input that receives an associated control signal from decoding circuitry 652 and an output that drives an associated word line. The circuits within peripheral block 650 may be powered on and off, with some circuits (e.g., word line drivers 654) being coupled to the power supply via head switch 610 and other circuits (e.g., control circuitry 651, decoding circuitry 652 and datapath circuitry 656) being coupled to circuit ground via foot switch 620.

Retention block 660 includes circuits used to maintain the word lines at a predetermined level when peripheral block 650 is powered off. For the embodiment shown in FIG. 6A, retention block 660 includes pull-up P-FET devices 662. One pull-up device 662 is provided for each word line and is coupled to a respective inverting buffer 658. Each pull-up device 662 has a source that couples directly to the power supply, VDD, a gate that receives the control signal PD, and a drain that couples to the input of the associated inverting buffer 658. Pull-up devices 662 prevent the word lines from floating in the standby mode, as described below.

In the operational mode, core block 640, peripheral block 650, and retention block 660 are all powered on. Peripheral block 650 is powered on by bringing the control signal PD to logic high, which enables both P-FET device 612 for head switch 610 and N-FET device 622 for foot switch 620. Retention block 660 is powered on but is disabled by the logic high for the control signal PD. Core block 640 and peripheral block 650 operate in the normal manner and perform the designed functions.

In the standby mode, core block 640 and retention block 660 are powered on and peripheral block 650 is powered off by bringing the control signal PD to logic low. Retention block 660 is also enabled by the logic low for the control signal PD, which turns on P-FET devices 662. The enabled P-FET devices 662 pull the inputs of the associated inverting buffers 658 to logic high, which then forces the outputs of inverting buffers 658 to logic low. Inverting buffers 658 drive the word lines to logic low, which is the proper signal level for this SRAM design. The logic low on the word lines prevents programming of memory cells 642 in the standby mode, as described above for FIG. 4A. Data within the memory cells are thus retained even when peripheral block 650 is powered off.

Figure 6B:
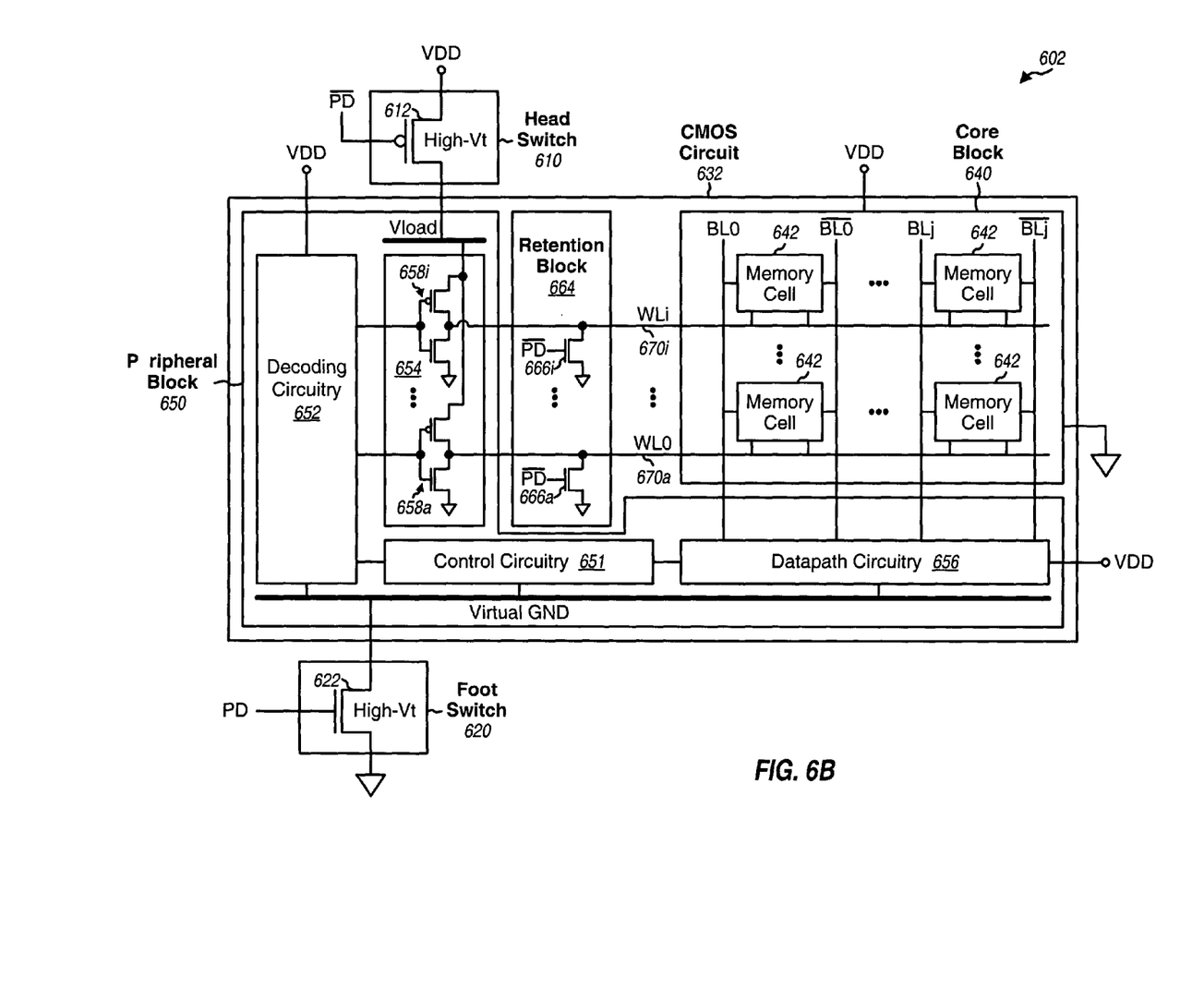

FIG. 6B shows a schematic diagram of a memory unit 602 with partitioned blocks and different retention circuitry. Memory unit 602 includes head switch 610, foot switch 620, and CMOS circuit 632 that comprises core block 640, peripheral block 650, and a retention block 664. Switches 610 and 620 and blocks 640 and 650 are coupled as described above for memory unit 600 in FIG. 6A. For the embodiment shown in FIG. 6B, retention block 664 includes pull-down N-FET devices 666. One pull-down device 666 is provided for each word line 670. Each pull-down device 666 has a source that couples directly to circuit ground, a gate that receives the control signal $\overline{PD}$, and a drain that couples to the associated word line 670. Pull-down devices 666 are turned on when the control signal $\overline{PD}$ is at logic high. The enabled pull-down N-FET devices 666 then pull word lines 670 to logic low, which prevents memory cells 642 from being written with data in the standby mode. Each of N-FET devices 666 may be designed with the proper size to drive the associated word line 670.

For the embodiments shown in FIGS. 6A and 6B, the core block and retention block may be implemented with high-Vt FET devices to reduce leakage current. Multi-port memory cells and/or other techniques may be used to support higher access rate for the memory cells in the core block. The peripheral block may be implemented with low-Vt FET devices for high-speed operation. Leakage current of the peripheral block is reduced by the use of high-Vt FET devices for the head and foot switches. For other embodiments, the core block and/or retention block may be implemented with low-Vt FET devices for high-speed operation.

Figure 7:
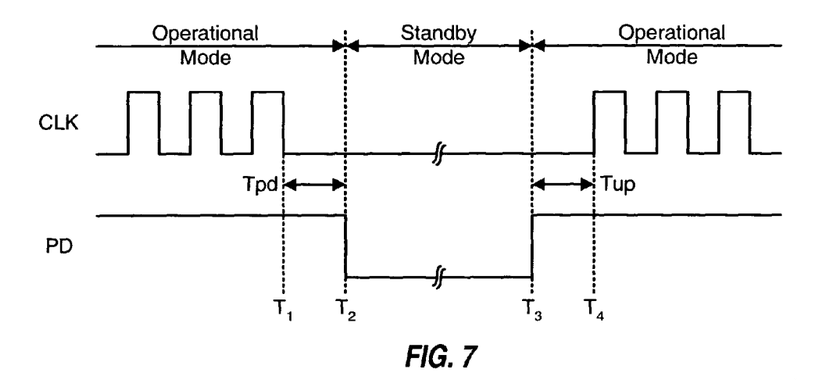
FIG. 7 shows a timing diagram for the memory units in FIGS. 6A and 6B.

FIG. 7 shows a timing diagram for some of the control signals in memory units 600 and 602. The circuits within the peripheral block are powered on and off by the control signal PD and operate based on a clock signal CLK. In FIG. 7, the memory unit is initially in the operational mode, the control signal PD is at logic high to turn on the head and foot switches, and the clock signal CLK is active. To transition from the operational mode to the standby mode, the clock signal CLK is first disabled at time $T_1$. The circuits within the core and peripheral blocks are given a sufficient amount of time Tpd to settle down their internal states. At time $T_2$, which is Tpd after time $T_1$, the control signal PD is brought to logic low, which turns off the head and foot switches and powers down the peripheral block. To transition from the standby mode to the operational mode, the control signal PD is first brought to logic high at time $T_3$, which turns on the head and foot switches and powers on the peripheral block. Again, the circuits within the core and peripheral blocks are given a sufficient amount of time Tup to settle down their internal states. At time $T_4$, which is Tup after time $T_3$, the clock signal CLK is enabled, and the circuits within the core and peripheral blocks operate in the normal manner. In an example design, the delays Tpd and Tup are selected such that Tpd=Tup≧40 nsec.

The techniques described herein partition a CMOS circuit into a core block and a peripheral block to achieve high-speed operation in the operational mode and reduced leakage current in the standby mode. A retention block is also provided, if necessary, to retain the internal states of the core block (e.g., data within the memory cells) in the standby mode. The techniques described herein may be used in various devices and apparatuses such as a wireless communication device (e.g., a cellular phone or a terminal), a portable computer, a personal digital assistant (PDA), and similar devices. Moreover, these techniques may be used for various end applications such as wireless communication, data communication, networking, and computers. As examples, the techniques described herein may be used for a cellular phone or a terminal in a code division multiple access (CDMA) system, a time division multiple access (CDMA) system, a time division multiple access (TDMA) system, a multiple-input multiple-output (MIMO) system, an orthogonal frequency division multiple access (OFDMA) system, or an orthogonal frequency division multiplexing (OFDM) system. A CDMA system may implement IS-95, IS-2000, Wideband CDMA (W-CDMA), and/or some other standards. A TDMA system may implement Global System for Mobile Communications (GSM) and/or some other standards.

Figure 8:
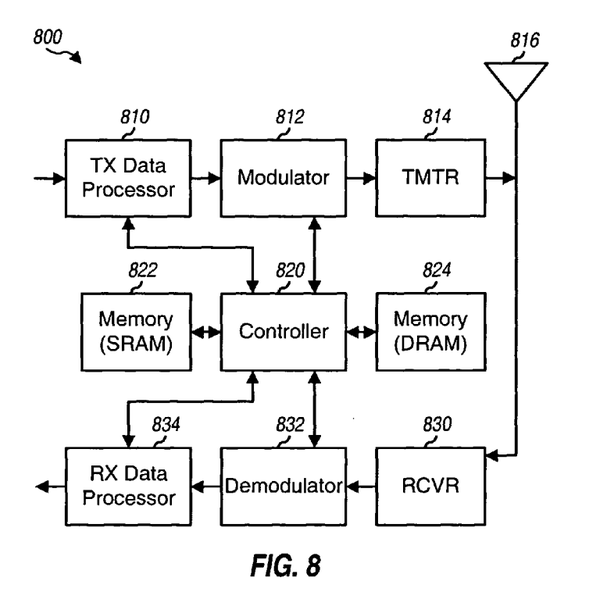
FIG. 8 shows a wireless communication device.

FIG. 8 shows a wireless communication device 800 in which the techniques described herein may be implemented. Device 800 may be a cellular phone, a user terminal, or other similar device in a wireless communication system (e.g., a CDMA system).

For data transmission, a transmit (TX) data processor 810 receives, formats, encodes, and interleaves traffic data and provides coded data. A modulator 812 then modulates (i.e., symbol maps) the coded data and performs other physical layer processing. For a CDMA system, modulator 812 may (1) multiplex the modulated data with pilot data, (2) channelize or cover the data for each code channel with an orthogonal code assigned to that code channel, (3) combine the channelized data for all code channels, and (4) spectrally spread the combined data with a pseudo-random number (PN) sequence to obtain a sequence of chips. A transmitter unit (TMTR) 814 then processes the sequence of chips to obtain a modulated signal, which is transmitted via an antenna 816.

For data reception, a transmitted signal from a base station is received by antenna 816 and provided to a receiver unit (RCVR) 830. Receiver unit 830 conditions and digitizes the received signal to obtain a stream of data samples. A demodulator 832, which may implement a rake receiver, then processes the data samples to obtain demodulated data. For a CDMA system, the processing by demodulator 832 may include (1) descrambling the data samples with a despreading sequence for the base station, (2) channelizing the descrambled samples with orthogonal codes to segregate the received data onto different code channels, and (3) coherently demodulating the received data for each code channel with pilot estimates to obtain the demodulated data for that code channel. A receive (RX) data processor 834 then deinterleaves and decodes the demodulated data for each code channel to obtain decoded data.

Controller 820 directs various operations at device 800. Memory units 822 and 824 store data and codes for controller 820. Memory unit 822 may be an SRAM and memory unit 824 may be a DRAM.

Any one or combination of the processing units shown in FIG. 8 may be implemented with the techniques described herein. For example, memory unit 822 and/or 824 may be implemented as shown in FIG. 6A or 6B. As another example, controller 820 may be implemented with blocks as shown in FIG. 2 or 5.

Figure 9:
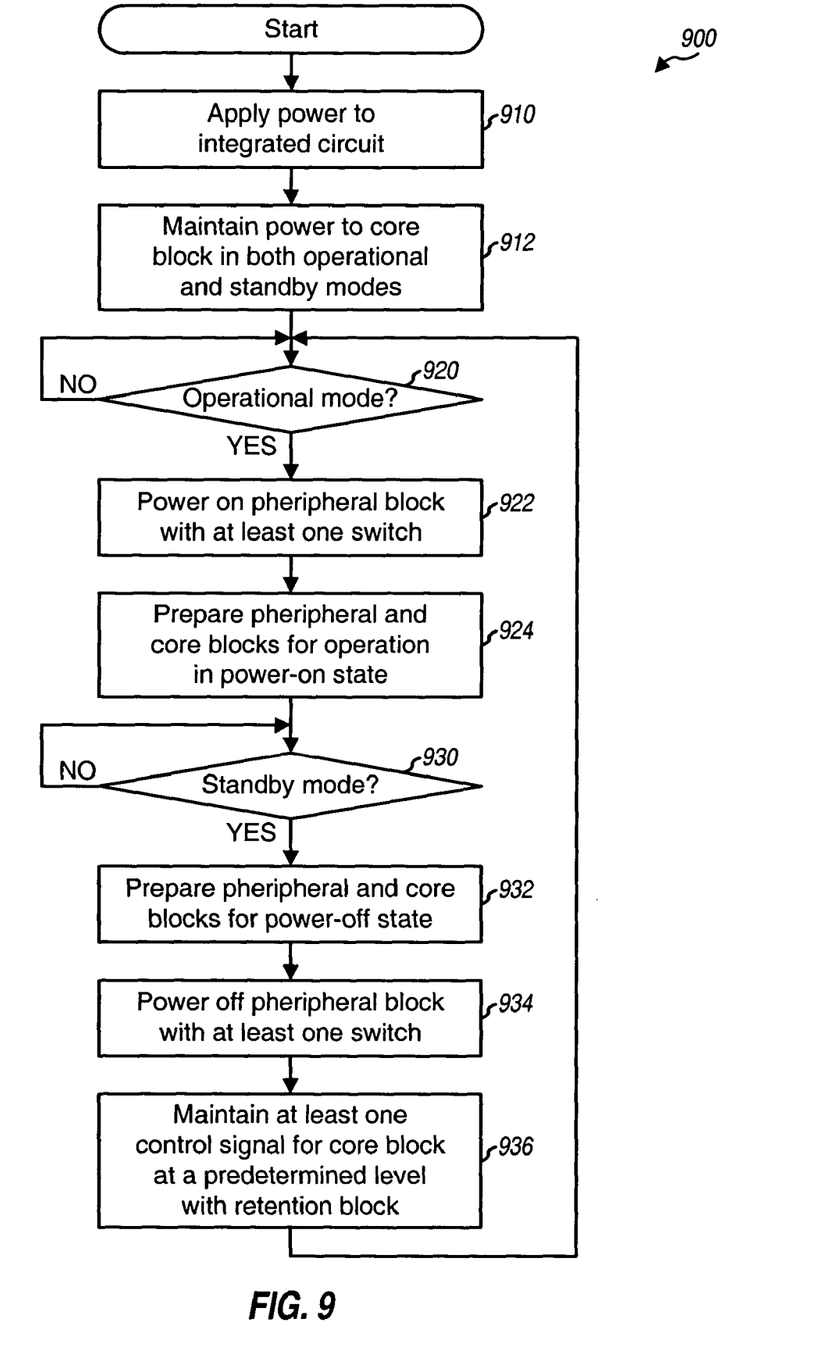
FIG. 9 shows a flow diagram of a process for operating an integrated circuit in a manner to reduce leakage current.

FIG. 9 shows a flow diagram of a process 900 for operating an integrated circuit in a manner to reduce leakage current. The integrated circuit includes a core block, a peripheral block, at least one switch, and possibly a retention block. The core block comprises high-Vt FET devices, the peripheral block comprises low-Vt FET devices, and the retention block comprises at least one FET device.

Initially, power is applied to the integrated circuit (step 910). Power is maintained to the core block in both operational and standby modes (step 912). The core block may be directly coupled to the power supply and circuit ground. The peripheral block is powered on in the operational mode and powered off in the standby mode. From step 912, the process proceeds to step 920.

If the integrated circuit is transitioning to the operational mode from the initial power-up or from the standby mode (as determined in step 920), then the peripheral block is powered on by turning on the at least one switch (step 922). The peripheral and core blocks are prepared for operation in the power-on state (step 924). This preparation may entail disabling the clock signal for Tup seconds after powering on the peripheral block and allowing the core and peripheral blocks sufficient time to settle down their internal states, as shown in FIG. 7. From step 924, the process proceeds to step 930.

If the integrated circuit is transitioning to the standby mode from the operational mode (as determined in step 930), then the peripheral and core blocks are prepared for the power-off state (step 932). This preparation may entail disabling the clock signal for Tdn seconds prior to powering off the peripheral block and allowing the core and peripheral blocks sufficient time to settle down their internal states; as also shown in FIG. 7. The peripheral block is then powered off by turning off the at least one switch (step 934). The internal states of the core block are maintained when the peripheral block is powered off. This may be achieved by maintaining at least one control signal for the core block at a predetermined level with the retention block when the peripheral block is powered off (step 936). From step 936, the process returns to step 920.

The integrated circuit may be operated in other manners to reduce leakage current, and this is within the scope of the invention. For example, the integrated circuit may operate in more than two modes and/or other steps may be performed for the transition between modes. The control of the operation of the integrated circuit may be implemented with hardware or software. For a software implementation, the operation of the integrated circuit may be controlled with modules (e.g., procedures, functions). The software codes for the modules may be stored in a memory unit (e.g., memory unit 822 or 824 in FIG. 8) and executed by a processor (e.g., controller 820).

In general, the techniques described herein may be used for various processing units such as a memory unit, an application specific integrated circuit (ASIC), a digital signal processor (DSP), a programmable logic device (PLD), a field programmable gate array (FPGA), a processor, a controller, a micro-controller, a microprocessor, and similar devices.

The techniques described herein may also be implemented in various IC process technologies such as CMOS, NMOS, and similar devices. CMOS technology can fabricate both N-FET and P-FET devices on the same die, whereas NMOS technology can only fabricate N-FET devices. The techniques may also be used for different device size technologies (e.g., 0.13 mm, 90 nm, 30 nm, etc). In general, the techniques described herein are more effective and beneficial as the IC process technology scales smaller (i.e., to smaller "feature" or device length).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a core block comprised of a plurality of high threshold voltage (high-Vt) field effect transistor (FET) devices;
   a peripheral block comprised of a plurality of low threshold voltage (low-Vt) FET devices;
   at least one switch coupled to the peripheral block and operable to power on or off the peripheral block, and
   a retention block comprised of at least one FET device operable to maintain at least one control signal at a predetermined level when the peripheral block is powered off.

2. The integrated circuit of claim 1, wherein the peripheral block is powered on in an operational mode and powered off in a standby mode.

3. The integrated circuit of claim 1, wherein the core block includes memory cells and the peripheral block includes support circuitry for the memory cells.

4. The integrated circuit of claim 1, wherein the core block is directly coupled to a power supply and circuit ground.

5. The integrated circuit of claim 1, wherein the at least one switch includes a head switch coupled between a power supply and the peripheral block.

6. The integrated circuit of claim 5, wherein the at least one switch further includes a foot switch coupled between the peripheral block and circuit ground.

7. A memory unit comprising:
   a core block comprised of a plurality of high threshold voltage (high-Vt) field effect transistor (FET) devices configured to implement memory cells;
   a peripheral block comprised of a plurality of low threshold voltage (low-Vt) FET devices configured to implement support circuitry for the memory cells;
   at least one switch coupled to the peripheral block and operable to power on or off the peripheral block, and
   a retention block operable to maintain a set of control signals at a predetermined level when the peripheral block is powered off.

8. The memory unit of claim 7, wherein the memory unit is implemented as static random access memory (SRAM).

9. The memory unit of claim 7, wherein the memory unit is implemented as dynamic random access memory (DRAM).

10. The memory unit of claim 8, wherein the retention block comprises a plurality of pull-up FET devices operable to maintain the set of control signals at the predetermined level to retain data within the memory cells.

11. The memory unit of claim 8, wherein the set of control signals is a set of word lines for the memory cells and is maintained at logic low when the peripheral block is powered off.

12. The memory unit of claim 7, wherein the at least one switch includes
   a head switch coupled between a power supply and the peripheral block, and
   a foot switch coupled between the peripheral block and circuit ground.

13. The memory unit of claim 7, wherein the memory cells are dual-bank memory cells.

14. The memory unit of claim 7, wherein the peripheral block includes word line drivers for the memory cells in the core block.

15. A memory unit comprising:
   a core block comprised of a plurality of high threshold voltage (high-Vt) field effect transistor (FET) devices configured to implement memory cells;
   a peripheral block comprised of a plurality of low threshold voltage (low-Vt) FET devices configured to implement support circuitry for the memory cells;
   at least one switch coupled to the peripheral block and operable to power on or off the peripheral block,
   wherein a clock signal for the peripheral block is disabed Tpd seconds prior to powering down the peripheral block and is enabled Tup seconds after powering up the peripheral block, where Tpd and Tup each denotes a non-zero time period.

16. A wireless device comprising an integrated circuit having
   a core block comprised of a plurality of high threshold voltage (high-Vt) field effect transistor (FET) devices;
   a peripheral block comprised of a plurality of low threshold voltage (low-Vt) FET devices;
   at least one switch coupled to the peripheral block and operable to power on or off the peripheral block, and
   a retention block operable to maintain at least one control signal at a predetermined level.

17. The wireless device of claim 16, wherein the integrated circuit implements a static random access memory (SRAM).

18. The wireless device of claim 16, wherein the integrated circuit implements a digital signal processor (DSP).

19. The wireless device of claim 16, wherein the integrated circuit implements a controller.

20. The wireless device of claim 16, wherein said device is operable in a code division multiple access (CDMA) communication system.

21. An apparatus comprising:
   a core block comprised of a plurality of high threshold voltage (high-Vt) field effect transistor (FET) devices;
   a peripheral block comprised of a plurality of low threshold voltage (low-Vt) FET devices;
   means for powering on and off the peripheral block; and
   retention means for maintaining a set of control signals at a predetermined level when the peripheral block is powered off.

* * * * *